United States Patent
Rho (10) Patent No.: US 8,013,318 B2
(45) Date of Patent: Sep. 6, 2011

(54) PHASE CHANGE RANDOM ACCESS MEMORY FOR ACTIVELY REMOVING RESIDUAL HEAT AND METHOD OF MANUFACTURING THE SAME

(75) Inventor: Dae Ho Rho, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 129 days.

(21) Appl. No.: 12/494,530

(22) Filed: Jun. 30, 2009

(65) Prior Publication Data

US 2010/0288993 A1    Nov. 18, 2010

(30) Foreign Application Priority Data

May 12, 2009 (KR) .......................... 10-2009-0041164

(51) Int. Cl.
*H01L 47/00* (2006.01)

(52) U.S. Cl. ........ 257/2; 257/42; 257/246; 257/E27.001

(58) Field of Classification Search ................. 257/2, 42, 257/246, E47.001

See application file for complete search history.

(56) References Cited

U.S. PATENT DOCUMENTS

| | | | |
|---|---|---|---|
| 2004/0164290 A1* | 8/2004 | Yi et al. | 257/4 |
| 2007/0075347 A1 | 4/2007 | Lai et al. | |
| 2009/0065758 A1* | 3/2009 | Chao | 257/4 |
| 2009/0166602 A1* | 7/2009 | Kum | 257/4 |
| 2009/0302299 A1* | 12/2009 | Chang | 257/4 |

* cited by examiner

*Primary Examiner* — Cuong Q Nguyen
*Assistant Examiner* — Trang Q Tran
(74) *Attorney, Agent, or Firm* — Ladas & Parry LLP (57) ABSTRACT

A phase change random access memory for actively removing residual heat and a method of manufacturing the same are presented. The phase change random access memory includes a semiconductor substrate, a phase change pattern, a heating electrode and a cooling electrode. The phase change pattern is on the semiconductor substrate. The heating electrode is electrically coupled to the phase change pattern for heating the phase change pattern. The cooling electrode is electrically coupled to the phase change pattern for removing residual heat from the phase change pattern.

18 Claims, 6 Drawing Sheets

PHASE CHANGE RANDOM ACCESS MEMORY FOR ACTIVELY REMOVING RESIDUAL HEAT AND METHOD OF MANUFACTURING THE SAME

CROSS-REFERENCES TO RELATED APPLICATION

The present application claims priority under 35 U.S.C. 119(a) to Korean application number 10-2009-0041164, filed on May 12, 2009, in the Korean Patent Office, which is incorporated by reference in its entirety as if set forth in full.

BACKGROUND OF THE INVENTION

1. Technical Field

The present invention relates to memory devices and methods of manufacturing the same. More particularly, the invention relates to phase change random access memory (PRAM) devices that are configured to efficiently remove residual heat.

2. Related Art

Memory devices can be classified into volatile memory devices or non-volatile memory devices. Volatile memory devices can include random access memory (RAM) devices in which input information is lost if power is shut off. Non-volatile memory devices can include read only memory (ROM) devices in which input information is preserved even if power is shut off. Presently dynamic RAM (DRAM) and a synchronous RAM (SRAM) are often used as RAM devices and flash memory devices are often times used as ROM devices.

DRAMs are advantageous in that power consumption is relatively low and random access is possible. However, DRAMs are volatile and the capacitance of a capacitor in the DRAMs must be increased due to high charge storage capacity. SRAMs are often used as cache memories and are advantageous in that random access is possible and fast operation speeds are also possible. However, SRAM are volatile and their associated manufacturing cost is increased due to a large size of the SRAM. Further, although flash memories are non-volatile, flash memories have a stack structure of two gates, and therefore require higher operating voltages than supply voltage. That is, flash memories require a boosting circuit to generate necessary voltage needed to perform the record and erase operations. Further flash memories may not as easily adapted to be compressed into highly integrated formats and their operating speeds are relatively slow.

In order to address some of these problems associated with memory devices, ferroelectric RAMs (FRAMs), magnetic RAMs (MRAMs) and phase change RAMs (PRAMs) have been developed.

Among these, PRAMs contains phase change material that often times exhibit high resistances in an amorphous solid state and lower resistances in a crystalline ordered solid state. Accordingly, PRAMS can be used to record and read information based on the particular phase the phase change material by exploiting this change in resistance. PRAM promise faster operating speeds and higher integration degree as compared with the flash memory.

Oftentimes PRAMs include a heating electrode for heating the phase change material to drive the phase change of the phase change material. The heating electrode often include a material having a relatively high resistivity to achieve a high heat efficiency under the condition of same electric current, and have a narrow sectional area.

However, after the crystalline state of the phase change material has been initiated by the heating electrode, then residual heat in and around the phase change material remains which can cause thermal and mechanical stresses to the PRAM.

In this regard, the latent heat, which remains after the phase change process, must be removed to improve the electrical reliability of the PRAM.

SUMMARY

A phase change memory device capable of effectively removing heat remaining after a phase change process to improve the device reliability and a method of manufacturing the same are disclosed herein.

According to one embodiment, a phase change random access memory includes a semiconductor substrate, a phase change pattern formed on the semiconductor substrate, a heating electrode structure electrically connected with the phase change pattern to heat the phase change pattern, and a cooling electrode structure electrically connected with the phase change pattern to remove heat remaining in the phase change pattern.

According to another embodiment, a phase change random access memory includes a semiconductor substrate, an interlayer dielectric layer formed on the semiconductor substrate, a heating electrode structure formed in the interlayer dielectric layer, a cooling electrode structure formed in the interlayer dielectric layer while being spaced apart from the heating electrode structure by a predetermined distance, and a phase change pattern formed on the interlayer dielectric layer to be electrically connected with the heating electrode structure and the cooling electrode structure.

According to further another embodiment, a method for manufacturing a phase change random access memory is provided. First, a semiconductor substrate is provided. An interlayer dielectric layer is formed on the semiconductor substrate. A heating electrode structure and a cooling electrode structure are formed in the interlayer dielectric layer. A phase change pattern is formed to be electrically coupled to the heating electrode structure and to the cooling electrode structure.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
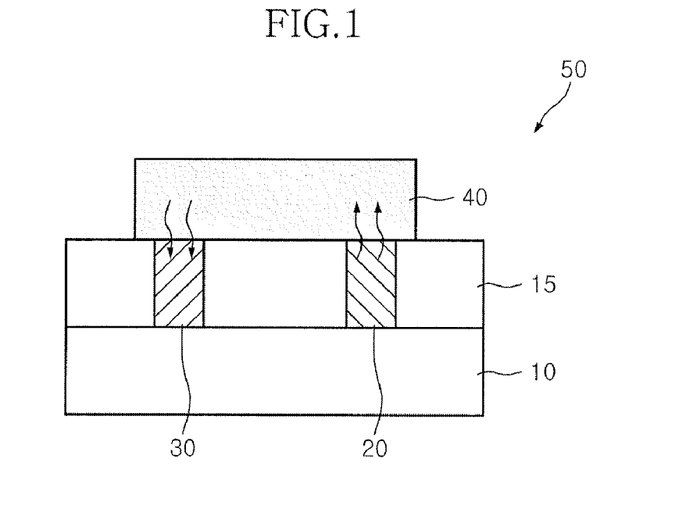
FIG. 1 is a schematic sectional view of a PRAM for explaining a concept of the disclosure.

FIG. 1 is a schematic sectional view of a PRAM for explaining a concept of the disclosure. It is understood herein that the drawings are not necessarily to scale and in some instances proportions may have been exaggerated in order to more clearly depict certain features of the invention.

Referring now to FIG. 1, the PRAM 50 can include a heating electrode structure 20 that heats a phase change material 40 formed on a semiconductor substrate 10 and includes a cooling electrode structure 30 that removes residual heat.

The heating electrode structure 20 can be in direct contact with the phase change material 40 so that it can efficiently apply heat to the phase change material 40 when electric current is applied to the heating electrode structure 20. For example, the heating electrode structure 20 can include conductive material having high resistivity.

The cooling electrode structure 30 can also be in direct contact with the phase change material 40 so that it can efficiently remove the residual heat in the phase change material 40 when electric current is applied to the cooling electrode structure 30. A Peltier element can be used as the cooling electrode structure 30. As generally known in the art, the Peltier element performs heating and cooling operations by switching the direction of electric current, and can include two metal materials different from each other or heterogeneous semiconductor materials. For example, when direct current is applied to the Peltier element, heat absorption, that is, cooling can occur at the junction between the two metal materials or between the heterogeneous semiconductor materials. According heat from a specific object can be is absorbed using the Peltier effect.

The Peltier effect has been extensively employed in any number of different types of equipment such as in household dehumidifiers, functional cosmetics boxes, mechanical board cooling panels, and distribution panel test tube boxes. Representative thermoelectric material is generally used at the normal temperature and the intermediate temperature. The representative normal temperature Peltier element can include Bi—Te based material such as $Bi_2Te_3$ and $Bi_2Se_3$. The intermediate temperature Peltier element can include PbS, PbTe, PdTe—Ge—Te and PbTe—SnTe-based material.

Reference numeral 15 denotes an interlayer dielectric layer that is used to thermally insulate the heating electrode structure 20 away from the cooling electrode structure 30.

According to the present embodiment as described above, the cooling electrode structure 30 having a Peltier element is installed in the PRAM having the phase change material 40 so that residual heat can be more efficiently removed by the cooling electrode structure 30 when cooling is performed on the phase change material 40. Accordingly, stress and resultant cracks caused by residual heat in the phase change material 40 can be protected against.

Figure 2:
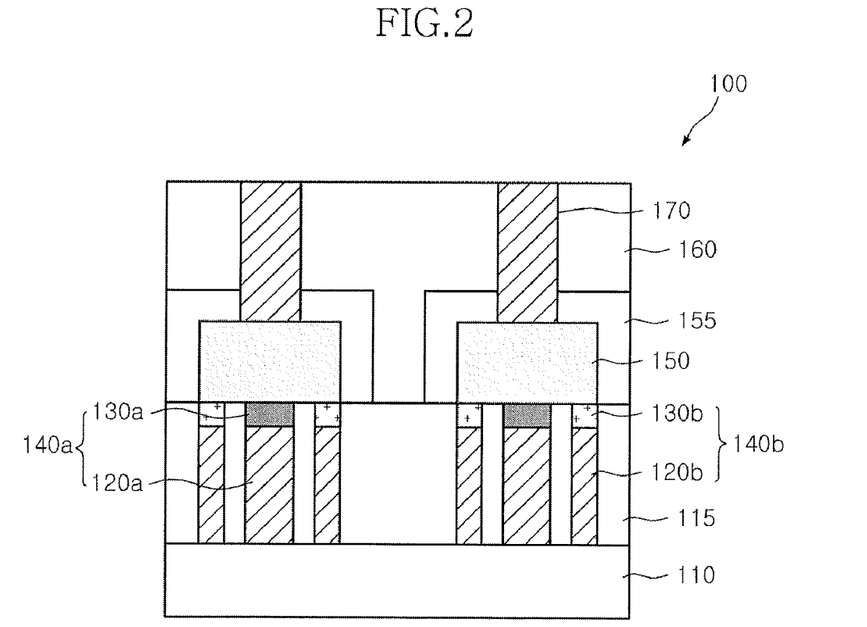
FIG. 2 is a sectional view showing a structure of an example of a PRAM in accordance with one embodiment.

FIG. 2 is a sectional view showing a structure of an example of a PRAM in accordance with one embodiment.

Referring now to FIG. 2, the PRAM 100 of the present embodiment can include a semiconductor substrate 110; an interlayer dielectric layer 115 including a heating electrode structure 140a and a cooling electrode structure 140b formed on the semiconductor substrate 110; and a phase change pattern 150 electrically coupled to the heating electrode structure 140a and to the cooling electrode structure 140b.

The semiconductor substrate 110 can be a silicon substrate and can include a current source (not shown). The current source can include a junction area (not shown) or a switching device (not shown) in contact with the junction area. The heating electrode structure 140a and the cooling electrode structure 140b can be electrically connected with the current source of the semiconductor substrate 110.

The heating electrode structure 140a can include a first electrode 120a and a heating layer 130a. The first electrode 120a can include various conductive layers capable of transmitting electric current therethrough. In consideration of adhesion properties of the interlayer dielectric layer 115 and the heating layer 130a, Ti/TiN can be used for the first electrode 120a. The heating layer 130a is formed on the first electrode 120a to heat the phase change pattern 150 by using electric current received from the first electrode 120a. A polysilicon (Poly-Si) layer or a silicon germanium (SiGe) layer, either of which have relatively high resistivity, can be used as the heating layer 130a. The heating layer 130a is preferably formed at the center of the bottom of the phase change pattern 150 to efficiently provide the requisite heat to drive the solid state phase changes of the phase change pattern 150. It is preferable that the first electrode 120a can be formed with the same width as that of the heating layer 130a.

The cooling electrode structure 140b can include a second electrode 120b and a cooling layer 130b. Similarly to the first electrode 120a, the second electrode 120b can include various conductive layers capable of transmitting electric current therethrough. According to the present embodiment, the second electrode 120b preferably includes Ti/TiN which is the same material as that of the first electrode 120a. The second electrode 120b can be disposed almost anywhere near or on the phase change pattern 150. Preferably the second electrode 120b is at a bottom periphery of the phase change pattern 150 while being spaced apart from the first electrode 120a at a predetermined distance. The cooling layer 130b is formed on the second electrode 120b so that it can cool the phase change pattern 150 by using electric current received from the second electrode 120b. The cooling layer 130b is preferably composed of a Peltier element layer, which can cause the Peltier effect. That is, the cooling layer 130b preferably has two conductive layers interfaced together (e.g. such as Bi/At) that cause endothermic reaction when receiving an electric current. The cooling electrode structure 140b is preferably spaced separately apart from the heating electrode structure 140a at a predetermined distance. Preferably the cooling electrode structure 140b efficiently removes residual heat that remains after the phase change operation has occurred without adversely influencing the heating operation of the phase change pattern 150 driven by the heating electrode structure 140a.

When viewed in a plan view, the heating electrode structure 140a can be in direct contact with a part of the phase change pattern 150, and the cooling electrode structure 140b is shown formed along the lower periphery of the phase change pattern 150 and can have a ring shape.

The phase change pattern 150 is formed on the interlayer dielectric layer 115 to be in contact with the heating electrode structure 140a and the cooling electrode structure 140b disposed along the outer surface of the phase change pattern 150. Preferably, the phase change pattern 150 is disposed at one phase change memory cell in a one-to-one fashion.

The phase change pattern 150 can be covered by a capping layer 155. As generally known in the art, the capping layer 155 can protect against separation of the phase change pattern 150 due to volumetric displacement changes driven by solid phase changes of the phase change pattern 150. The capping layer 155 can also protect against or block diffusion of material constituting the phase change pattern 150. The capping layer 155 can preferably be composed of a silicon oxide layer or a silicon nitride layer.

An upper interlayer dielectric layer 160 is also shown formed on the capping layer 155. An upper electric contact 170 is also shown formed through the upper interlayer dielectric layer 160 and through the capping layer 155 so that the upper electric contact 170 efficiently electrically couples with the phase change pattern 150.

Accordingly it is preferable that the PRAM 100 has the above structure, in which the cooling electrode structure 140b including the cooling layer 130b, that causes the Peltier effect, is disposed at a periphery around the heating electrode structure 140a. The cooling electrode structure 140b is preferably in direct contact with the phase change pattern 150, so that residual heat in the phase change pattern 150 can be efficiently extracted after the phase change operation of the phase change pattern 150.

Figure 3A:
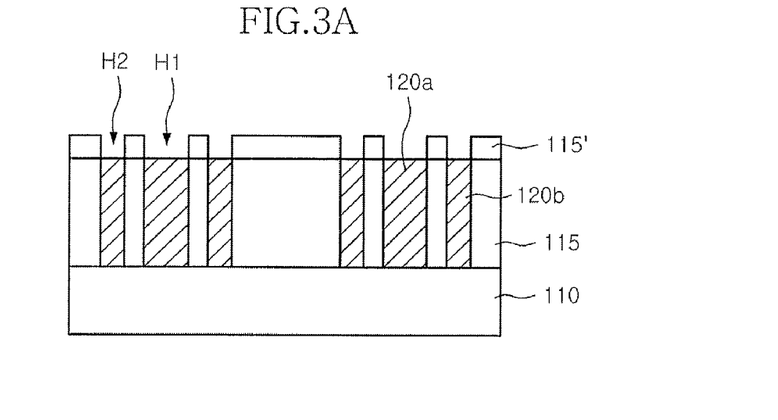
FIGS. 3A to 3C are sectional views illustrating a procedure for manufacturing the PRAM shown in FIG. 2.
Figure 3B:
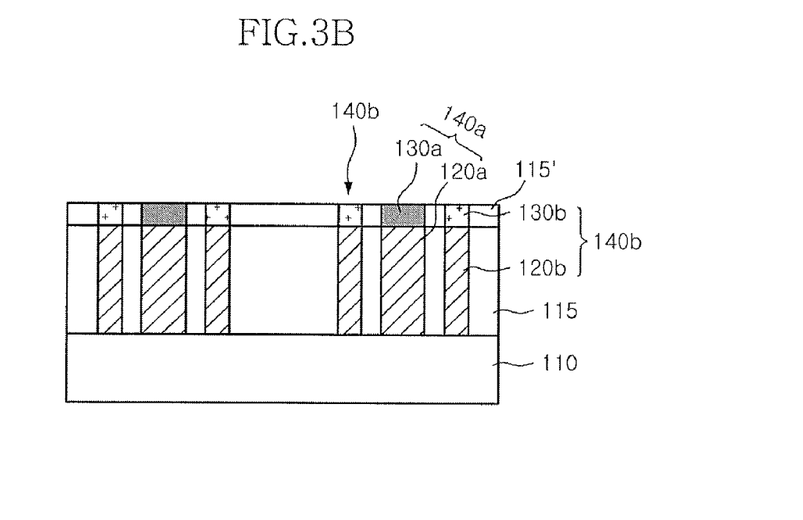
Figure 3C:
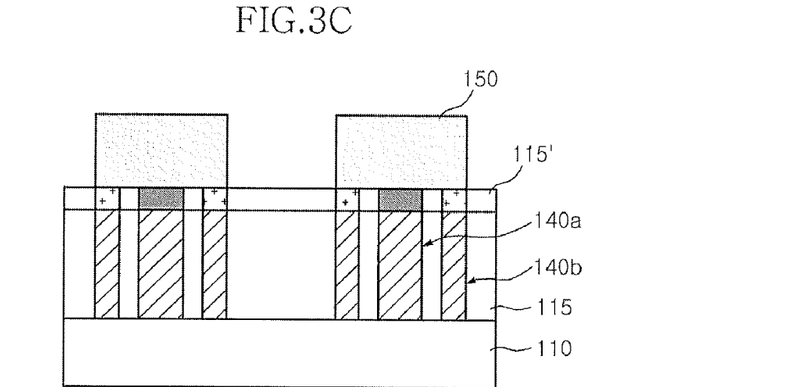

FIGS. 3A to 3C are sectional views illustrating a procedure for manufacturing the PRAM shown in FIG. 2.

Referring now to FIG. 3A, a first interlayer dielectric layer 115 is formed on the semiconductor substrate 110 in which the semiconductor substrate 110 includes a current source (not shown). First and second contact holes (not shown) are next formed through the first interlayer dielectric layer 115 so that the current source (not shown) can be exposed. The first and second contact holes are formed in each phase change memory cell. Preferably, the second contact hole surrounds a periphery of the first contact hole. A conductive layer, such as a Ti/TiN layer, is then deposited on the first interlayer dielectric layer 115 to fill in the first and second contact holes. Thereafter, the conductive layer is planarized to expose the surface of the first interlayer dielectric layer 115, so that the first electrode 120a is formed in the first contact hole and the second electrode 120b is formed in the second contact hole. The first electrode 120a preferably has a width equal to or greater than the second electrode 120b.

Next, a second interlayer dielectric layer 115' is formed on the first interlayer dielectric layer 115 including the first and second electrodes 120a and 120b. The second interlayer dielectric layer 115' can preferably be formed thinner than that of the first interlayer dielectric layer 115. Then, the second interlayer dielectric layer 115' is etched such that the first and second electrodes 120a and 120b are exposed, thereby forming a heating contact hole H1 and a cooling contact hole H2. Preferably, the heating contact hole H1 has a width the same as that of the first electrode 120a, and the cooling contact hole H2 has a width the same as that of the second electrode 120b.

As illustrated in FIG. 3B, the heating layer 130a is selectively filled in the heating contact hole H1 to form the heating electrode structure 140a, and the cooling layer 130b including the Peltier element is selectively filled in the cooling contact hole H2 to form the cooling electrode structure 140b. The selective filling of the heating layer 130a and the cooling layer 130b can be variously performed by using photolithographic processes generally known in the art.

As illustrated in FIG. 3C, a phase change material layer is deposited on the second interlayer dielectric layer 115', and is patterned such that the phase change material layer can be in contact with the heating electrode structure 140a and the cooling electrode structure 140b, so that the phase change pattern 150 is formed in each memory cell.

Next, the capping layer 155 is formed on the second interlayer dielectric layer 115' to surround the phase change pattern 150. As illustrated in FIG. 2, the capping layer 155 can surround only the phase change pattern 150, or can be uniformly formed on the entire upper surface of the second interlayer dielectric layer 115' including the phase change pattern 150. Then, the upper interlayer dielectric layer 160 is formed on the capping layer 155, and the upper interlayer dielectric layer 160 and the capping layer 155 are etched so that the phase change pattern 150 can be exposed to form an upper electrode contact hole (not shown). A conductive layer is filled in the upper electrode contact hole to form the upper electric contact 170.

Figure 4:
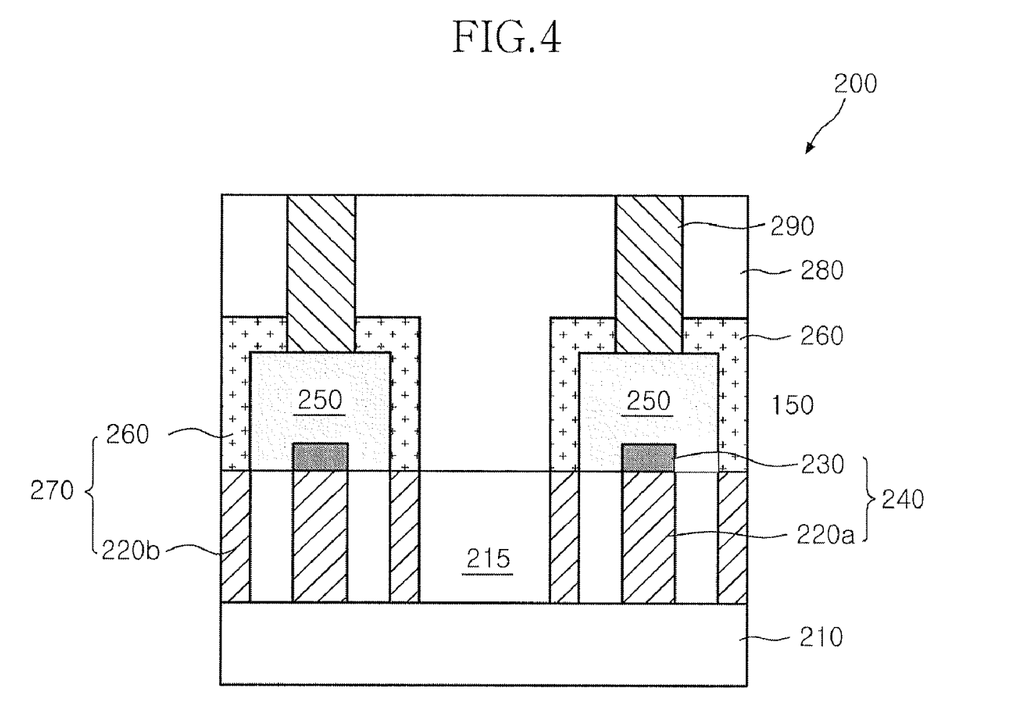
FIG. 4 is a sectional view showing a structure of an example of a PRAM in accordance with another embodiment.

FIG. 4 is a sectional view showing a structure of an example of a PRAM in accordance with another embodiment.

Referring now to FIG. 4, the PRAM 200 of the present embodiment can include a cooling electrode structure 270 that surrounds upper and side surfaces of a phase change pattern 250.

In more detail, the PRAM 200 can include a semiconductor substrate 210 having a current source (not shown), and an interlayer dielectric layer 215, similarly to the previous embodiment.

A first electrode 220a constituting a heating electrode structure 240 and a second electrode 220b constituting a cooling electrode structure 270 are formed in the interlayer dielectric layer 215. The first electrode 220a can be in connect with the center of the bottom of the phase change pattern 250 and the second electrode 220b can surround a periphery of the first electrode 220a while being spaced apart from the first electrode 220a at a predetermined distance. Similarly to the previous embodiment, the first and second electrodes 220a and 220b can be formed of a conductive layer such as a Ti/TiN layer.

A heating layer 230, which constitutes the heating electrode structure 240 together with the first electrode 220a, is formed in the phase change pattern 250 on the first electrode 220a.

Further, a cooling layer 260, which constitutes the cooling electrode structure 270 together with the second electrode 220b, can serve as a capping layer to surround the outer surface of the phase change pattern 250. The heating layer 230 and the cooling layer 260 can be formed with the material described in the previous embodiment.

According to the PRAM 200 having the above structure, the cooling electrode structure 270, that is, the cooling layer 260 is formed to completely surround the outer surface of the phase change pattern 250, so that residual heat in the phase change pattern 250 can be more effectively removed.

Reference numeral 280 represents an upper interlayer dielectric layer and reference numeral 290 represents an upper electrode contact.

Figure 5A:
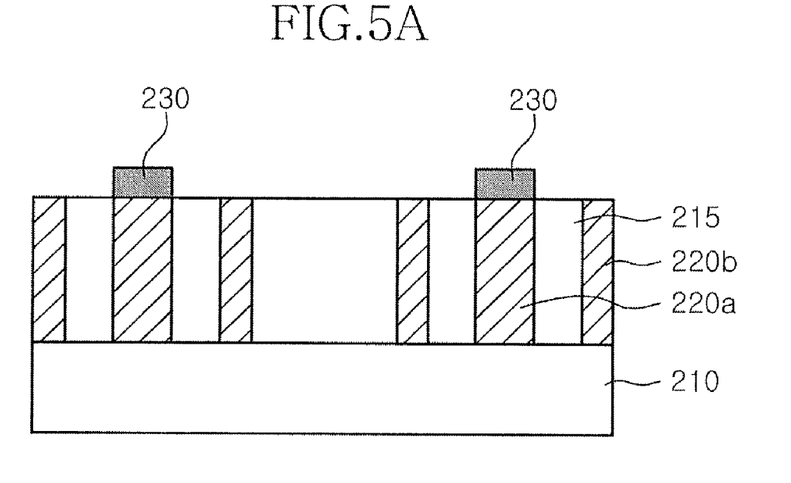
FIGS. 5A and 5B are sectional views illustrating a procedure for manufacturing the PRAM shown in FIG. 4.
Figure 5B:
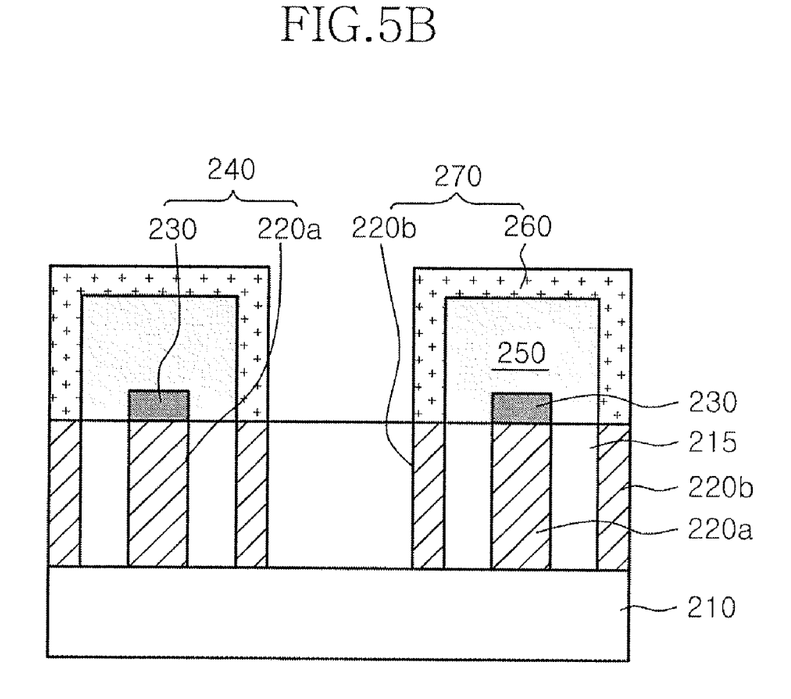

FIGS. 5A and 5B are sectional views illustrating a procedure for manufacturing the PRAM shown in FIG. 4.

Referring to FIG. 5A, the interlayer dielectric layer 215 is formed on the semiconductor substrate 210 including the current source (not shown). Next, first and second contact holes (not shown) are formed in the interlayer dielectric layer 215 such that the current source can be exposed. Preferably, the first and second contact holes are formed in each phase change memory cell. Preferably, the second contact hole surrounds a periphery of the first contact hole. According to the present embodiment, the distance between the first and second contact holes can be larger than the distance between the first and second contact holes of the previous embodiment.

Then, a conductive layer, such as a Ti/TiN layer, is deposited on the interlayer dielectric layer 215 to fill the first and second contact holes. Thereafter, the conductive layer is planarized to expose the surface of the interlayer dielectric layer 215, so that the first electrode 220a is formed in the first contact hole and the second electrode 220b is formed in the second contact hole. Preferably the first electrode 220a has a width equal to or greater than that of the second electrode 220b.

Next, heating material having a predetermined thickness is deposited on the interlayer dielectric layer 215, and is patterned such that the heating material is located on the first electrode 220a, thereby forming the heating layer 230. Preferably, the heating layer 230 can be formed with a width the same as that of the first electrode 220a.

Then, a phase change material layer is deposited on the interlayer dielectric layer 215 including the heating layer 230, and is partially patterned to form the phase change pattern 250. The phase change pattern 250 is formed in each memory cell in a one-to-one fashion and can include the heating layer 230.

Thereafter, the cooling layer 260 is formed on the interlayer dielectric layer 215 including the phase change pattern 250. As described above, the cooling layer 260 can include the Peltier element. Preferably, in order to improve the cooling efficiency of the phase change pattern 250, the sidewall of the cooling layer 260 coincides with the sidewall of the second electrode 220b. To this end, the cooling layer 260 can be deposited with a width corresponding to the width of the second electrode 220b. The cooling layer 260 can be spaced apart from an adjacent cooling layer 260 to individually surround each phase change pattern 250.

Then, the upper interlayer dielectric layer 280 and the upper electrode contact 290 are formed through the process generally known in the art.

Figure 6:
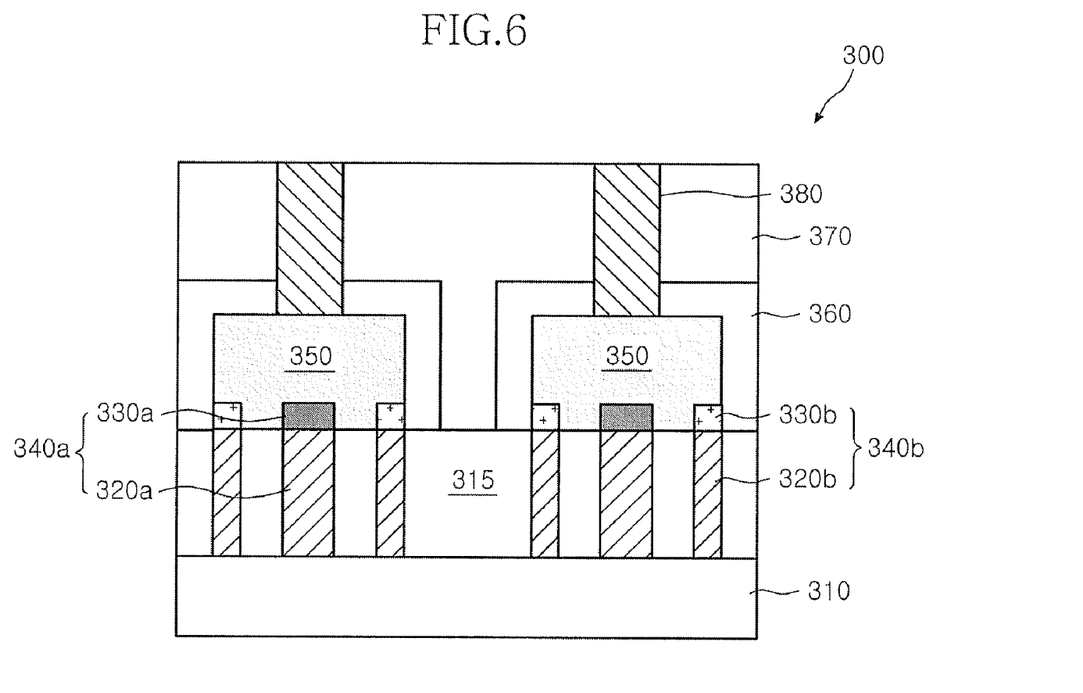
FIG. 6 is a sectional view showing a structure of an example of a PRAM in accordance with further another embodiment.

FIG. 6 depicts a sectional view showing a structure of an example of a PRAM in accordance with further another embodiment.

Referring now to FIG. 6, the PRAM 300 of the present embodiment can include a phase change pattern 350 having a heating layer 330a and a cooling layer 330b.

In more detail, the PRAM 300 of the present embodiment can include a semiconductor substrate 310 having a current source (not shown), and an interlayer dielectric layer 315 including first and second electrodes 320a and 320b, similarly to the previous embodiment.

Further, the first and second electrodes 320a and 320b can be formed with a conductive layer such as a Ti/TiN layer. The first electrode 320a can be in contact with the center of the bottom of the phase change pattern 350 and the second electrode 320b can surround the first electrode 320a while being spaced apart from the first electrode 320a at a predetermined distance.

The heating layer 330a, which constitutes a heating electrode structure 340a together with the first electrode 320a, is formed in the phase change pattern 350 on the first electrode 320a. The cooling layer 330b, which constitutes a cooling electrode structure 340b together with the second electrode 320b, is formed in the phase change pattern 350 on the second electrode 320b. The heating layer 330a and the cooling layer 330b can be formed with the material described in the previous embodiment.

According to the PRAM 300 having the above structure, the heating layer 330a, which constitutes a heating electrode structure 340a, and the cooling layer 330b, which constitutes a cooling electrode structure 340b, are formed in the phase change pattern 350, so that a solid state phase of the phase change pattern 350 can be efficiently converted and so that residual heat in the phase change pattern 350 can be efficiently removed.

Reference numeral 370 represents an upper interlayer dielectric layer and reference numeral 380 represents an upper electrode contact.

Figure 7A:
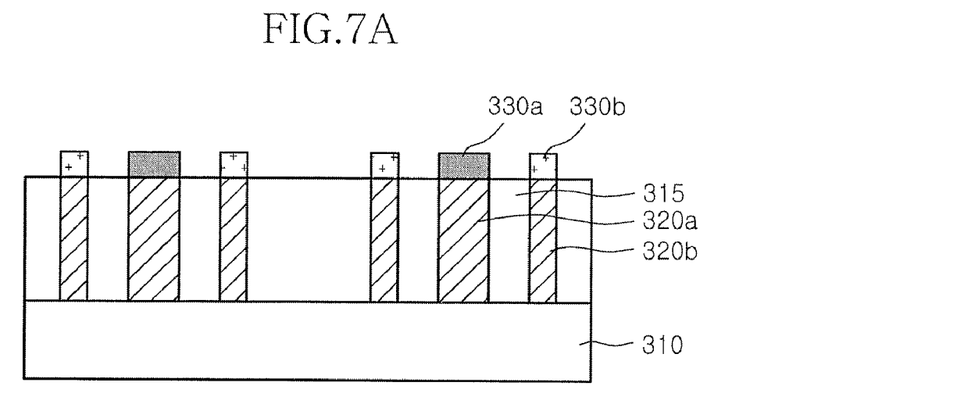
FIGS. 7A and 7B are sectional views illustrating a procedure for manufacturing the PRAM shown in FIG. 6.
Figure 7B:
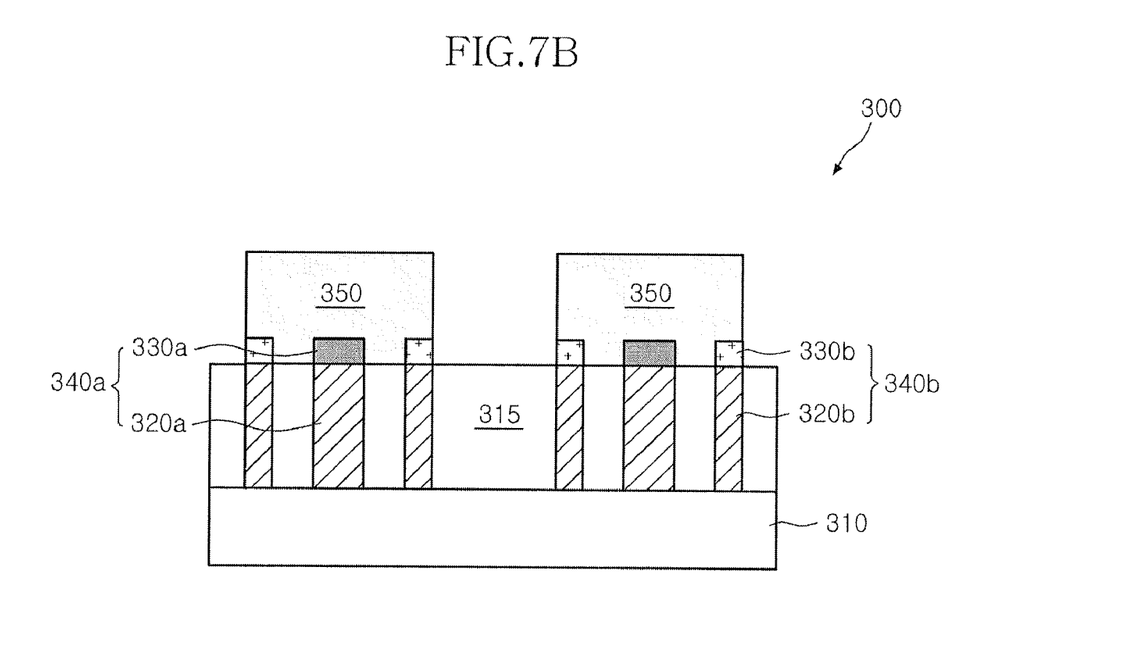

FIGS. 7A and 7B are sectional views illustrating a procedure for manufacturing the PRAM shown in FIG. 6.

Similarly to the previous embodiment, the interlayer dielectric layer 315 including the first and second electrodes 320a and 320b is formed on the semiconductor substrate 310.

As illustrated in FIG. 7A, heating material having a predetermined thickness is deposited on the interlayer dielectric layer 315, and is patterned such that the heating material is located on the first electrode 320a and forms the heating layer 330a. Preferably, the heating layer 330a can be formed with the same width as that of the first electrode 320a. Next, cooling material having a predetermined thickness is deposited on the interlayer dielectric layer 315, and is partially patterned such that the cooling material can be in contact with the second electrode 320b form the cooling layer 330b. The cooling layer 330b can be formed with the same width as that of the second electrode 320b, and can be formed with the same thickness as that of the heating layer 330a. Preferably, in order to maximize the cooling and heating transfer efficiencies, the sidewall of the heating layer 330a can coincide with the sidewall of the first electrode 320a and the sidewall of the cooling layer 330b can coincide with the sidewall of the second electrode 320b. According to the present embodiment, the heating layer 330a is primarily formed. However, the present invention is not limited thereto. That is, the cooling layer 330b can be primarily formed.

As illustrated in FIG. 7B, a phase change material layer is deposited on the interlayer dielectric layer 315 including the heating layer 330a and the cooling layer 330b. The phase change material layer is partially patterned to include the heating layer 330a and the cooling layer 330b to thereby form the phase change pattern 350 in each memory cell. Then, the capping layer 360, the upper interlayer dielectric layer 370 and the upper electrode contact 380 are formed by using the generally known processes in the art.

According to the present invention as described above, various cooling electrode structures including the Peltier element are formed in the phase change memory cells. Thus, heat remaining after change of the crystalline state of the phase change pattern can be easily cooled by the cooling electrode structures, so that thermal and mechanical stresses caused by the remaining heat can be reduced.

However, the present invention is not limited to the above embodiments.

According to some of the above embodiments, the cooling electrode structure can have a ring shape that surrounds the heating structure. However, the present invention is not limited thereto. That is, various cooling electrode structures can be employed if the cooling electrode structures can remove the latent heat by being in contact with the phase change pattern.

Further, the cooling electrode structure includes a Bi/At laminate. However, the present invention is not limited thereto. That is, various layers, such as a Bi/Te laminate and a P type semiconductor layer/an N type semiconductor layer laminate, can be employed if they can provide the Peltier effect.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

What is claimed is:

1. A phase change random access memory comprising:
a semiconductor substrate;
a phase change pattern on the semiconductor substrate;
a heating electrode electrically coupled to the phase change pattern for actively heating the phase change pattern; and
a cooling electrode electrically coupled to the phase change pattern for actively removing residual heat in the phase change pattern; wherein the heating electrode and the cooling electrode form in a planar surface and space apart form each other.

2. The phase change random access memory as claimed in claim 1, wherein the cooling electrode comprises a laminate of heterogeneous conductive layers that exhibit different electrical conductivity which provide a Peltier cooling effect.

3. The phase change random access memory as claimed in claim 2, wherein the laminate of heterogeneous conductive layers is selected from the group consisting of a Bi/At laminate, a Bi/Te laminate, and a p-type semiconductor layer/n-type semiconductor layer laminate.

4. The phase change random access memory as claimed in claim 1, wherein the heating electrode comprises:
a first electrode formed on the semiconductor substrate; and
a heating layer formed on the first electrode.

5. The phase change random access memory as claimed in claim 2, wherein the heating layer is directly connected to a bottom centered at the phase change pattern.

6. The phase change random access memory as claimed in claim 3, wherein the heating layer is formed in the phase change pattern.

7. The phase change random access memory as claimed in claim 1, wherein the cooling electrode comprises:
a second electrode formed on the semiconductor substrate; and
a cooling layer formed on the second electrode.

8. The phase change random access memory as claimed in claim 7, wherein the cooling layer surrounds the phase change pattern.

9. The phase change random access memory as claimed in claim 7, wherein the cooling layer is formed in the phase change pattern.

10. A phase change random access memory comprising:
a semiconductor substrate;
an interlayer dielectric layer formed on the semiconductor substrate;
a heating electrode formed in the interlayer dielectric layer;
a cooling electrode formed in the interlayer dielectric layer such that the cooling electrode is spaced away from the heating electrode at a predetermined distance; and
a phase change pattern formed on the interlayer dielectric layer electrically coupled to the heating electrode and to the cooling electrode.

11. The phase change random access memory as claimed in claim 10, wherein the heating electrode comprises:
a first electrode on the semiconductor substrate; and
a heating layer on the first electrode.

12. The phase change random access memory as claimed in claim 11, wherein the heating layer is located in the interlayer dielectric layer.

13. The phase change random access memory as claimed in claim 11, wherein the heating layer is located in the phase change pattern.

14. The phase change random access memory as claimed in claim 10, wherein the cooling electrode comprises:
a second electrode on the semiconductor substrate; and
a cooling layer on the second electrode, wherein the cooling layer is configured to provide a Peltier cooling effect.

15. The phase change random access memory as claimed in claim 14, wherein the cooling layer is located in the interlayer dielectric layer.

16. The phase change random access memory as claimed in claim 14, wherein the cooling layer is formed on the interlayer dielectric layer surrounds upper and side parts of the phase change pattern.

17. The phase change random access memory as claimed in claim 14, wherein the cooling layer is in the phase change pattern.

18. The phase change random access memory as claimed in claim 15, wherein a sidewall of the cooling layer coincides with a sidewall of the phase change pattern.

* * * * *